United States Patent
Yosui

(10) Patent No.: US 10,477,704 B2
(45) Date of Patent: Nov. 12, 2019

(54) MULTILAYER BOARD AND ELECTRONIC DEVICE

(71) Applicant: Murata Manufacturing Co., Ltd., Nagaokakyo-shi, Kyoto-fu (JP)

(72) Inventor: Kuniaki Yosui, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/197,405

(22) Filed: Nov. 21, 2018

(65) Prior Publication Data

US 2019/0090362 A1 Mar. 21, 2019

Related U.S. Application Data

(63) Continuation of application No. PCT/JP2017/043570, filed on Dec. 5, 2017.

(30) Foreign Application Priority Data

Dec. 27, 2016 (JP) .................... 2016-253844

(51) Int. Cl.
*H05K 1/02* (2006.01)
*H05K 1/03* (2006.01)
(Continued)

(52) U.S. Cl.
CPC .......... *H05K 3/4691* (2013.01); *H05K 1/028* (2013.01); *H05K 1/0278* (2013.01);
(Continued)

(58) Field of Classification Search
CPC .. H05K 3/4691; H05K 3/4635; H05K 3/4652; H05K 3/4602; H05K 3/4614;
(Continued)

(56) References Cited

U.S. PATENT DOCUMENTS 5,262,594 A * 11/1993 Edwin .................. H05K 3/3452
174/254
6,350,387 B2 * 2/2002 Caron .................. H05K 3/4691
174/254

(Continued)

FOREIGN PATENT DOCUMENTS

JP 7-94868 A 4/1995
JP 2002-158445 A 5/2002

(Continued)

OTHER PUBLICATIONS

Official Communication issued in International Patent Application No. PCT/JP2017/043570, dated Mar. 6, 2018.

*Primary Examiner* — Ishwarbhai B Patel
(74) *Attorney, Agent, or Firm* — Keating & Bennett, LLP

(57) ABSTRACT

A multilayer board includes a first base material substrate including insulating base material layers that are laminated, a second base material substrate laminated on the first base material substrate to straddle a stepped portion, and a third base material substrate laminated on the second base material. The first base material substrate includes first and second conductor patterns respectively provided on surfaces in contact with the second base material substrate. The third base material substrate includes third and fourth conductor patterns. The second base material substrate includes a first interlayer connection conductor connecting the first and third conductor patterns, and a second interlayer connection conductor connecting the second and fourth conductor patterns, and has a higher flowability than the first and third base material substrates during lamination.

19 Claims, 8 Drawing Sheets

(51) Int. Cl.
*H05K 1/11* (2006.01)
*H05K 1/14* (2006.01)
*H05K 1/18* (2006.01)
*H05K 3/46* (2006.01)

(52) U.S. Cl.
CPC ........... *H05K 1/0393* (2013.01); *H05K 1/111* (2013.01); *H05K 1/14* (2013.01); *H05K 1/18* (2013.01); *H05K 3/4602* (2013.01); *H05K 3/4635* (2013.01); *H05K 3/4652* (2013.01); *H05K 1/0284* (2013.01); *H05K 1/036* (2013.01); *H05K 1/0313* (2013.01); *H05K 1/118* (2013.01); *H05K 1/119* (2013.01); *H05K 3/4614* (2013.01); *H05K 2201/0129* (2013.01); *H05K 2201/0141* (2013.01); *H05K 2201/09845* (2013.01)

(58) Field of Classification Search
CPC . H05K 2201/09845; H05K 2201/0141; H05K 2201/0129; H05K 1/0277; H05K 1/0278; H05K 1/028; H05K 1/0281; H05K 1/0283; H05K 1/0284; H05K 1/0313; H05K 1/036; H05K 1/0366; H05K 1/0393; H05K 1/111; H05K 1/112; H05K 1/113; H05K 1/115; H05K 1/118; H05K 1/119; H05K 1/14; H05K 1/144; H05K 1/147; H05K 1/189; H05K 2201/042; H05K 2201/05

See application file for complete search history.

(56) References Cited

U.S. PATENT DOCUMENTS

| | | |
|---|---|---|
| 2004/0112632 A1 | 6/2004 | Michiwaki et al. |
| 2007/0202306 A1* | 8/2007 | Nikaldo .................. H05K 1/148 428/195.1 |
| 2013/0321304 A1 | 12/2013 | Wang |
| 2016/0014893 A1 | 1/2016 | Yosui |

FOREIGN PATENT DOCUMENTS

| | | |
|---|---|---|
| JP | 2004-319962 A | 11/2004 |
| JP | 2006-179589 A | 7/2006 |
| JP | 2011-258739 A | 12/2011 |
| JP | 2012-227404 A | 11/2012 |
| WO | 2015/015975 A1 | 2/2015 |
| WO | 2016/171058 A1 | 10/2016 |

* cited by examiner

MULTILAYER BOARD AND ELECTRONIC DEVICE

CROSS REFERENCE TO RELATED APPLICATIONS

This application claims the benefit of priority to Japanese Patent Application No. 2016-253844 filed on Dec. 27, 2016 and is a Continuation Application of PCT Application No. PCT/JP2017/043570 filed on Dec. 5, 2017. The entire contents of each application are hereby incorporated herein by reference.

BACKGROUND OF THE INVENTION

1. Field of the Invention

The present invention relates to a multilayer board and an electronic device, and in particular, to a multilayer board that includes an insulating base material layer including a resin as a main material, and an electronic device including the multilayer board.

2. Description of the Related Art

Conventionally, multilayer boards are known which are formed by laminating a plurality of insulating base material layers including a resin as a main material, and partially different in the number of layers laminated.

For example, WO 2015/015975 discloses a multilayer board including a thick portion and a thin portion that is smaller than the thick portion in the number of insulating base material layers that are laminated. The above-described multilayer board may be connected to a circuit board or the like by utilizing the flexibility of the thin portion that is smaller than the thick portion in the number of insulating base material layers laminated.

However, the multilayer board disclosed in WO 2015/015975 includes a stepped portion with a different number of laminated layers in the vicinity of the boundary between the thick portion and the thin portion, and includes an insulating base material layer laminated so as to cover the stepped portion. Therefore, when a plurality of insulating base material layers are laminated, the stepped portion may interfere with the flow of the insulating base material layers including a resin as a main material, and after the lamination, gaps may be formed at the stepped portion, thus causing the separation of the multilayer board, and the like. In addition, when a high pressure is applied during laminating in order to prevent gaps from being generated at the stepped portion, the flow of the insulating base material layers including a resin as a main material may be increased, thus causing pattern deviations of conductors formed in contact with the multilayer board.

SUMMARY OF THE INVENTION

Preferred embodiments of the present invention provide multilayer boards each including a base material (insulating base material layer) laminated so as to cover a stepped portion due to a difference in the number of insulating base material layers that are laminated, which reduces or prevents the generation of gaps inside the multilayer board after lamination, and electronic devices each including the multilayer board.

A multilayer board according to a preferred embodiment of the present invention includes a first base material substrate including a plurality of insulating base material layers that are laminated and include a resin as a main material, the first base material substrate including a first region and a second region that is smaller in the number of insulating base material layers that are laminated than the first region; a second base material substrate laminated on the first base material to straddle a stepped portion provided at a boundary between the first region and the second region due to a difference in the number of the plurality of insulating base material layers that are laminated; and a third base material substrate laminated on the second base material, wherein the first base material includes a first conductor pattern provided on a surface in contact with the second base material substrate in the first region, and a second conductor pattern provided on a surface in contact with the second base material substrate in the second region, the third base material substrate includes a third conductor pattern and a fourth conductor pattern, and the second base material substrate includes a first interlayer connection conductor that connects the first conductor pattern and the third conductor pattern, and a second interlayer connection conductor that connects the second conductor pattern and the fourth conductor pattern, and has a higher flowability than the first base material substrate and the third base material substrate when the first base material substrate, the second base material substrate, and the third base material substrate are laminated.

With this configuration, when being laminated, the second base material substrate that has higher flowability than the first base material substrate and the third base material substrate is disposed on the first base material substrate so as to straddle the stepped portion provided due to a difference in the number of the plurality of insulating base material layers that are laminated. Therefore, as compared with the case in which a multilayer board includes a plurality of insulating base material layers made of the same material, it is possible to reduce or prevent the generation of gaps due to the stepped portion, and the separation of the multilayer board due to the generation of gaps.

In a multilayer board according to a preferred embodiment of the present invention, the multilayer board preferably includes a thick portion provided due to the stepped portion; and a thin portion provided due to the stepped portion, the thin portion having a smaller thickness than the thick portion in a lamination direction of the plurality of insulating base material layers, wherein the thin portion is flexible. With this configuration, the multilayer board is able to be easily disposed even within a limited space by utilizing the flexibility of the thin portion.

In a multilayer board according to a preferred embodiment of the present invention, the second base material substrate preferably entirely or substantially entirely overlaps with a portion at which the first base material substrate and the third base material substrate overlap with each other as viewed in the lamination direction of the plurality of insulating base material layers. This configuration reduces or prevents the formation of a new stepped portion after the lamination between the portion at which the second base material substrate is disposed and the other portion.

In a multilayer board according to a preferred embodiment of the present invention, the second base material substrate is preferably also joined to an end surface of the first base material substrate or an end surface of the third base material substrate. This configuration increases the joint area between the first base material substrate and the second base material substrate or the joint area between the second base material substrate and the third base material substrate becomes large, and improves the joint strength between the first base material substrate and the second base material substrate or the joint strength between the second base material substrate and the third base material substrate, thus reducing or preventing the separation of the multilayer board.

In a multilayer board according to a preferred embodiment of the present invention, the second base material substrate preferably has a lower elastic modulus than the first base material substrate and the third base material substrate. With this configuration, when the multilayer board is bent or deformed, the second base material substrate that has a lower elastic modulus than the first base material substrate and the third base material substrate is deformed in accordance with the deformations of the first base material substrate and the third base material substrate, thus reducing or preventing the separation due to a deformation or the defect of the multilayer board.

In a multilayer board according to a preferred embodiment of the present invention, the third conductor pattern and the fourth conductor pattern are preferably provided on a surface in contact with the second base material substrate, and the second base material substrate is preferably an insulating anisotropic conductive film. With this configuration, a portion of the insulating anisotropic conductive film sandwiched between the first conductor pattern and the third conductor pattern, when the first base material substrate, the second base material substrate, and the third base material substrate are stacked and then pressurized, establishes conduction under pressure, so that the first interlayer connection conductor is able to thus be easily provided. With this configuration, a portion of the insulating anisotropic conductive film sandwiched between the second conductor pattern and the fourth conductor pattern, when the first base material substrate, the second base material substrate, and the third base material substrate are laminated and then pressurized, establishes conduction under pressure, so that the second interlayer connection conductor is able to thus be easily provided.

In a multilayer board according to a preferred embodiment of the present invention, the first base material substrate and the third base material substrate preferably include conductor patterns other than the first conductor pattern, the second conductor pattern, the third conductor pattern, and the fourth conductor pattern, and a number of conductor patterns in an area that overlaps with the first interlayer connection conductor and a number of conductor patterns in an area that overlaps with the second interlayer connection conductor are preferably larger than the number of overlapping conductor patterns in the other area, as viewed in the lamination direction of the plurality of insulating base material layers. With this configuration, when the first base material substrate, the second base material substrate, and the third base material substrate are stacked and then pressurized, a pressure is more likely to be applied to the area that overlaps with the first interlayer connection conductor and the area that overlaps with the second interlayer connection conductor than the other areas, and the first interlayer connection conductor and the second interlayer connection conductor are unlikely to cause defective conduction.

In a multilayer board according to a preferred embodiment of the present invention, the first base material substrate and the third base material substrate may include conductor patterns other than the first conductor pattern, the second conductor pattern, the third conductor pattern, and the fourth conductor pattern, and a dummy conductor that is not connected to another conductor pattern may be disposed in the area that overlaps with the first interlayer connection conductor or in the area that overlaps with the second interlayer connection conductor, as viewed in the lamination direction of the plurality of insulating base material layers. A dummy conductor may be provided such that pressure is more likely to be applied to the area that overlaps with the first interlayer connection conductor or the area that overlaps with the second interlayer connection conductor than the other areas, when the first base material substrate, the second base material substrate, and the third base material substrate are stacked and then pressurized.

An electronic device according to a preferred embodiment of the present invention includes a multilayer board; and another board, wherein the multilayer board includes a first base material substrate including a plurality of insulating base material layers that are laminated and include a resin as a main material, the first base material substrate including a first region and a second region that is smaller in the number of insulating base material layers that are laminated than the first region; a second base material substrate laminated on the first base material substrate to straddle a stepped portion provided at a boundary between the first region and the second region due to a difference in the number of the plurality of insulating base material layers that are laminated; a third base material substrate laminated on the second base material; a thick portion provided due to the stepped portion; and a thin portion provided due to the stepped portion, the thin portion having a smaller thickness than the thick portion in the lamination direction of the plurality of insulating base material layers, wherein the thin portion is flexible, the first base material substrate includes a first conductor pattern provided on a surface in contact with the second base material substrate in the first region, and a second conductor pattern provided on a surface in contact with the second base material substrate in the second region, the third base material substrate includes a third conductor pattern and a fourth conductor pattern, the second base material substrate includes a first interlayer connection conductor that connects the first conductor pattern and the third conductor pattern, and a second interlayer connection conductor that connects the second conductor pattern and the fourth conductor pattern, and has higher flowability than the first base material substrate and the third base material substrate when the first base material substrate, the second base material substrate, and the third base material substrate are laminated, and the multilayer board is connected to the another board with the thin portion being bent.

This configuration makes it possible to achieve an electronic device including the multilayer board which reduces or prevents the generation of gaps inside the multilayer board after the first base material substrate, the second base material substrate, and the third base material substrate are laminated.

According to preferred embodiments of the present invention, it is possible to provide multilayer boards that each include a base material (insulating base material layer) laminated so as to cover a stepped portion due to a difference in the number of insulating base material layers that are laminated, which reduces or prevents the generation of gaps inside the multilayer board after lamination, and electronic devices each including the multilayer board.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
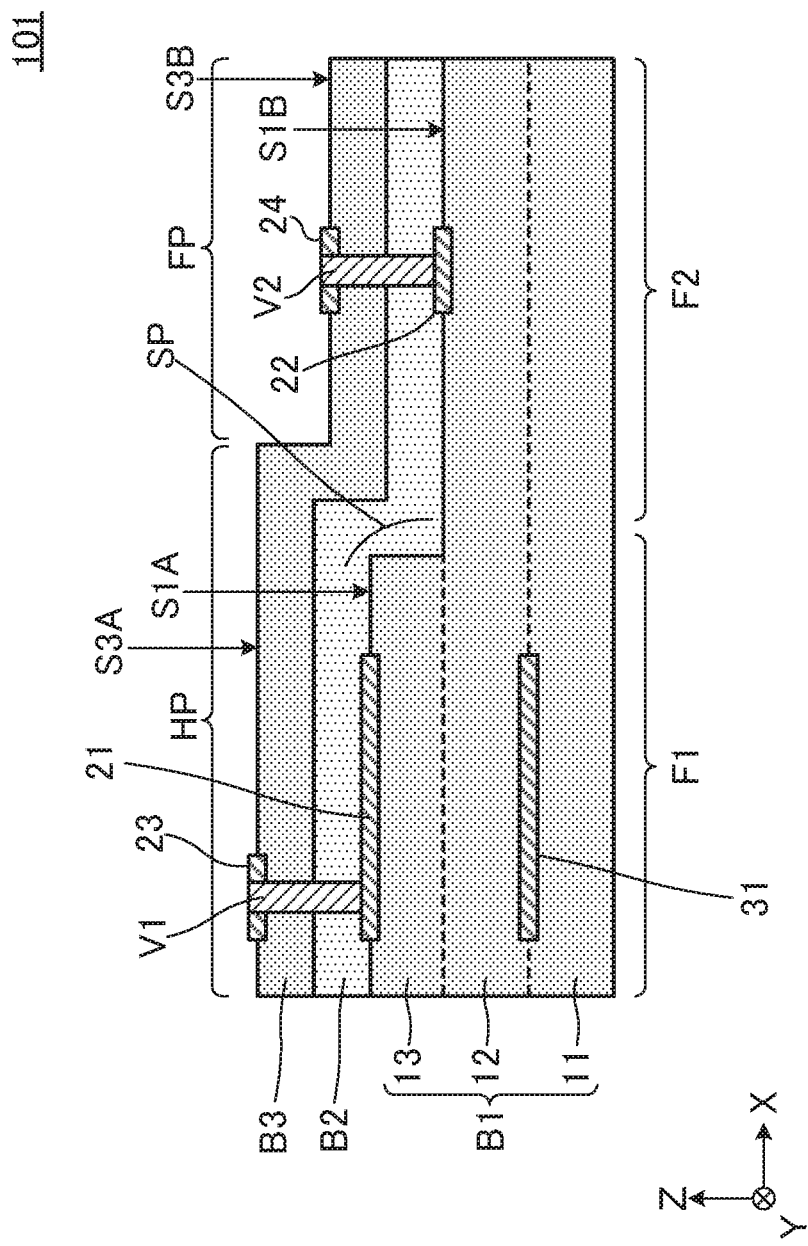
FIG. 1 is a cross-sectional view of a multilayer board 101 according to a first preferred embodiment of the present invention.

Hereinafter, preferred embodiments of the present invention will be described with reference to the drawings and specific examples. The same portions are denoted by the same reference numerals in the respective figures. The preferred embodiments are separately described in consideration of illustration of a main point or ease of understanding, but it is possible to partially substitute or combine the configurations provided in different preferred embodiments. In the second and subsequent preferred embodiments, descriptions of matters that are common to those of the first preferred embodiment will be omitted, and only differences therebetween will be described. In particular, the same actions and advantageous effects of the same configuration will not be sequentially described for each preferred embodiment.

First Preferred Embodiment

FIG. 1 is a cross-sectional view of a multilayer board 101 according to a first preferred embodiment of the present invention. It is to be noted that the thickness of each portion is shown in an exaggerated manner in FIG. 1. The same applies to the cross-sectional views shown subsequently.

The multilayer board 101 includes a first base material substrate B1, a second base material substrate B2, and a third base material substrate B3. The multilayer board 101 is, as shown in FIG. 1, formed by laminating the first base material substrate B1, the second base material substrate B2, and the third base material substrate B3 in this order.

The first base material substrate B1 is a laminate that preferably has a rectangular or substantially rectangular planar shape and that is formed by laminating a plurality of insulating base material layers 11, 12, 13 which have flexibility, and the laminate includes a first region F1 and a second region F2. As shown in FIG. 1, the first region F1 and the second region F2 include a different number of insulating base material layers laminated, and the second region F2 has a smaller number of laminated insulating base material layers than the first region F1. In addition, a stepped portion SP due to the difference number of the plurality of insulating base material layers 11, 12, 13 that are laminated is provided at the boundary between the first region F1 and the second region F2. The insulating base material layers 11, 12, 13 are sheets that include a resin as a main material, which are preferably, for example, sheets that include a liquid crystal polymer as a main material.

The first base material substrate B1 includes a first conductor pattern 21 provided on a surface S1A in contact with the second base material substrate B2 in the first region F1, a second conductor pattern 22 provided on a surface S1B in contact with the second base material substrate B2 in the second region F2, a conductor pattern 31 provided within the first base material substrate B1, and other suitable conductor patterns. The first conductor pattern 21, the second conductor pattern 22, and the conductor pattern 31 are preferably conductor patterns made of Cu foil or other suitable material, for example.

The second base material substrate B2 preferably has a rectangular or substantially rectangular planar shape and is laminated on the first base material substrate B1 so as to straddle (cover) the stepped portion SP. In addition, the second base material substrate B2 includes a first interlayer connection conductor V1 and a second interlayer connection conductor V2. According to the present preferred embodiment, the second base material substrate B2 overlaps with the entire or substantially the entire portion at which the first base material substrate B1 and the third base material substrate B3 overlap with each other as viewed in the lamination direction of the plurality of insulating base material layers 11, 12, 13 (Z axis direction). In addition, the second base material substrate B2 is preferably, for example, a resin sheet including an epoxy resin as a main material. The first interlayer connection conductor V1 and the second interlayer connection conductor V2 are preferably formed by, for example, a through-hole plating method.

The third base material substrate B3 preferably has a rectangular or substantially rectangular planar shape and is laminated on a surface of the second base material substrate B2 (an upper surface of the second base material B2 in FIG. 1) on the side opposite to the surface in contact with the first base material substrate B1. The third base material substrate B3 includes a third conductor pattern 23 and a fourth conductor pattern 24. The third conductor pattern 23 is provided on a surface S3A of the third base material substrate B3 on the side opposite to the surface in contact with the second base material substrate B2. The fourth conductor pattern 24 is provided on a surface S3B of the third base material substrate B3 on the side opposite to the surface in contact with the second base material substrate B2. The third base material substrate B3 is preferably, for example, a sheet including a liquid crystal polymer as a main material. The third conductor pattern 23 and the fourth conductor pattern 24 are preferably made of Cu foil or other suitable material, for example.

As shown in FIG. 1, the first interlayer connection conductor V1 connects the first conductor pattern 21 and the third conductor pattern 23. The second interlayer connection conductor V2 connects the second conductor pattern 22 and the fourth conductor pattern 24.

As will be described in detail later, the second base material substrate B2 according to the present preferred embodiment has a higher flowability than the first base material substrate B1 and the third base material substrate B3 when the first base material substrate B1, the second base material substrate B2, and the third base material substrate B3 are laminated (at the temperature of stacking, and then heating and pressurizing the first base material substrate B1, the second base material substrate B2, and the third base material substrate B3).

In addition, as shown in FIG. 1, the multilayer board 101 includes a thick portion HP and a thin portion FP that has a smaller thickness than the thick portion HP in the lamination direction of the plurality of insulating base material layers 11, 12, 13 (Z axis direction). The thick portion HP and the thin portion FP are provided due to the stepped portion SP of the first base material substrate B1. The thick portion HP is harder than the thin portion FP, and less likely to bend than the thin portion FP. On the other hand, the thin portion FP is more flexible than the thick portion HP, and is more likely to bend than the thick portion HP.

Figure 2:
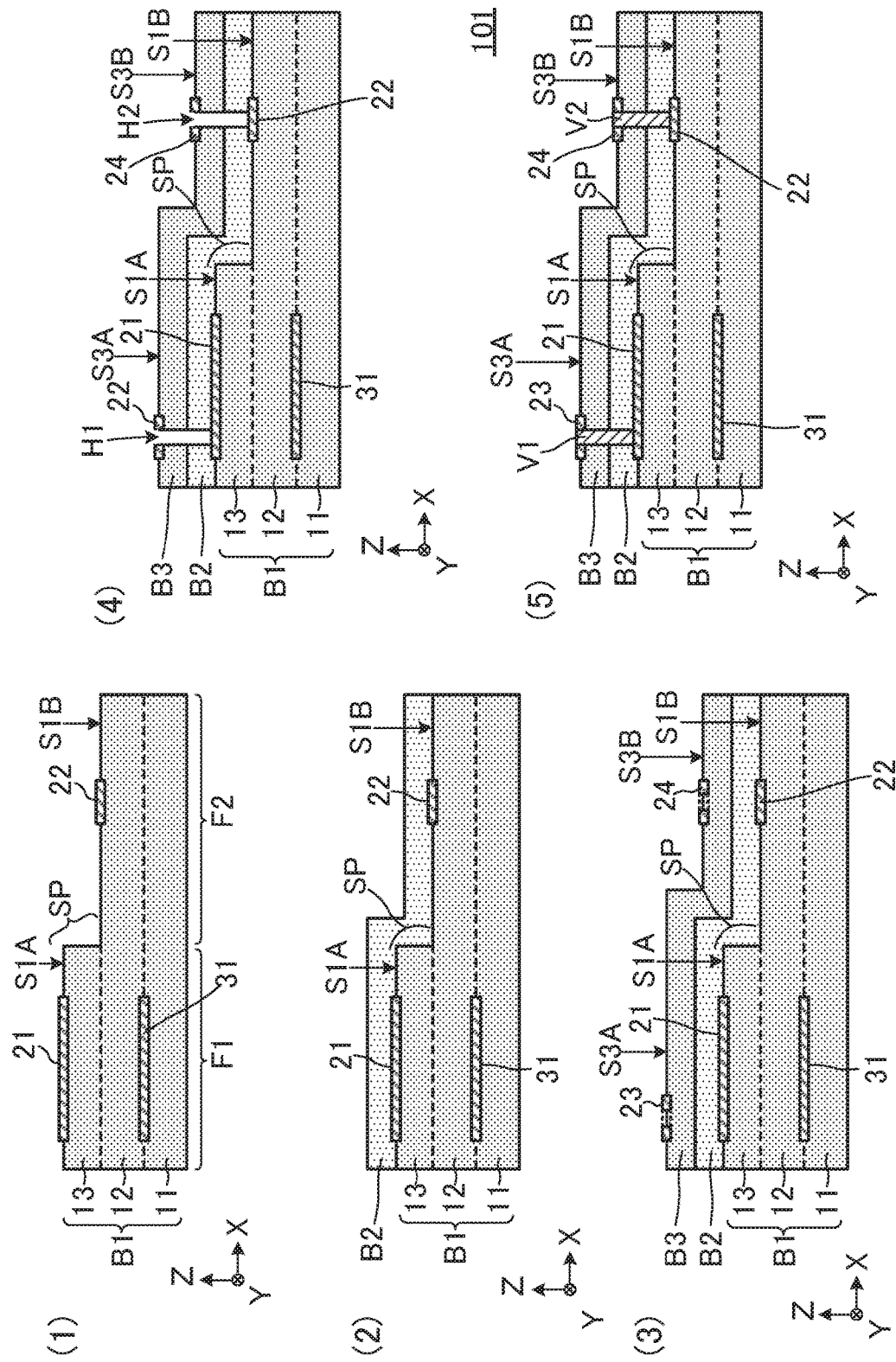
FIG. 2 is a cross-sectional view illustrating successive steps of manufacturing the multilayer board 101.

The multilayer board 101 according to the present preferred embodiment is manufactured by, for example, the following non-limiting example of a manufacturing method. FIG. 2 is a cross-sectional view illustrating successive steps of manufacturing the multilayer board 101. It is to be noted that in FIG. 2, for the convenience of explanation, a manufacturing process for individual pieces (one chip) will be described, but the actual process for manufacturing the multilayer board is performed for a collective board. The same applies to the cross-sectional view illustrating the subsequent manufacturing process.

First, as shown in step (1) of FIG. 2, the first base material substrate B1 is prepared.

The first base material substrate B1 is a laminate formed by stacking, and then heating and pressurizing the plurality of insulating base material layers 11, 12, 13 including a resin as a main material, and the laminate includes the first region F1 and the second region F2 which differ from each other in the number of insulating base material layers laminated. The second region F2 includes a smaller number of laminated insulating base material layers than the first region F1. The insulating base material layers 11, 12, 13 are preferably, for example, sheets including a liquid crystal polymer as a main material.

It is to be noted that the first conductor pattern 21, the second conductor pattern 22, and the conductor pattern 31 are respectively formed on the multiple insulating base material layers 11, 12, 13. Specifically, a metal foil (for example, Cu foil) is laminated on one main surface of the insulating base material layer 11, and the metal foil is subjected to patterning by photolithography to form the conductor pattern 31 on the insulating base material layer 11. A metal foil (for example, Cu foil) is laminated on one main surface of the insulating base material layer 12, and the metal foil is subjected to patterning by photolithography to form the second conductor pattern 22 on the insulating base material layer 12. In addition, a metal foil (for example, Cu foil) is laminated on one main surface of the insulating base material layer 13, and the metal foil is subjected to patterning by photolithography to form the first conductor pattern 21 on the insulating base material layer 13.

The insulating base material layer 13 has a smaller length in the longitudinal direction (Y axis direction) than the other insulating base material layers 11, 12. Therefore, the first base material B1 formed by laminating the plurality of insulating base material layers 11, 12, 13 includes, at the boundary between the first region F1 and the second region F2, the stepped portion SP formed due to a difference in the number of the plurality of insulating base material layers 11, 12, 13 that are laminated.

Next, as shown in step (2) of FIG. 2, the second base material substrate B2 is stacked on the first base material substrate B1 so as to straddle the stepped portion SP. Specifically, a semi-cured second base material substrate B2 is attached onto the first base material substrate B1 so as to cover the stepped portion SP. The second base material substrate B2 according to the present preferred embodiment has a higher flowability than the first base material substrate B1 and the third base material substrate B3 when the first base material substrate B1, the second base material substrate B2, and the third base material substrate B3 are laminated (at the temperature of stacking, and then heating and pressurizing the first base material substrate B1, the second base material substrate B2, and the third base material substrate B3). The second base material substrate B2 is preferably, for example, a semi-cured prepreg resin sheet including an epoxy resin as a main material.

It is to be noted that the second base material substrate B2 overlaps with the entire or substantially the entire portion at which the first base material substrate B1 and the third base material substrate B3 overlap with each other as viewed in the lamination direction of the plurality of insulating base material layers 11, 12, 13 (Z axis direction).

Thereafter, as shown in step (2) of FIG. 2, after the third base material substrate B3 on the second base material substrate B2 is stacked, the first base material substrate B1, second base material substrate B2, and third base material substrate B3 are laminated by heating and pressurizing to form a multilayer board 101A. The third base material substrate B3 is laminated on the surface of the second base material substrate B2 on the side opposite to the surface in contact with the first base material substrate B1. The third base material substrate B3 is preferably, for example, a sheet including a liquid crystal polymer as a main material.

Further, the third conductor pattern 23 and the fourth conductor pattern 24 are formed on the third base material substrate B3. Specifically, a metal foil (for example, Cu foil) is laminated on the other main surface of the insulating base material layer 13, and the metal foil is subjected to patterning by photolithography to form the third conductor pattern 23 and the fourth conductor pattern 24 on the third base material substrate B3. As shown in step (3) of FIG. 2, openings are formed in the center or approximate center of the third conductor pattern 23, and in the center or approximate center of the fourth conductor pattern 24.

Next, as shown in step (4) of FIG. 2, holes H1 and H2 are formed in the multilayer board 101A. The hole H1 is a hole that is formed toward the inside from one main surface (the surface S3A shown in step (4) of FIG. 2) of the multilayer board 101A to extend to the first conductor pattern 21. The hole H2 is a hole that is formed toward the inside from one main surface (the surface S3B shown in step (4) of FIG. 2) of the multilayer board 101A to extend to the second conductor pattern 22. The position at which the hole H1 is formed coincides with the position of the opening of the third conductor pattern 23. In addition, the position at which the hole H2 is formed coincides with the position of the opening of the fourth conductor pattern 24. The holes H1, H2 are formed by etching from one main surface of the multilayer board 101A with a laser or other suitable method after forming the multilayer board 101A. Alternatively, the holes H1, H2 may be formed by grinding, polishing, and etching with a drill or other suitable device.

Thereafter, the first interlayer connection conductor V1 and the second interlayer connection conductor V2 are formed. Specifically, the first interlayer connection conductor V1 according to the present preferred embodiment is a through hole provided with a plating film on the inner wall of the hole H1 by a plating treatment. In addition, the second interlayer connection conductor V2 according to the present preferred embodiment is a through hole provided with a plating film on the inner wall of the hole H2 by a plating treatment. Thus, the first conductor pattern 21 and the third conductor pattern 23 are connected by the first interlayer connection conductor V1. In addition, the second conductor pattern 22 and the fourth conductor pattern 24 are connected by the second interlayer connection conductor V2.

After the foregoing steps, individual boards are separated from the collective board to obtain the multilayer board 101 as shown in in step (5) of FIG. 2.

The multilayer board 101 according to the present preferred embodiment produces the following advantageous effects.

According to the present preferred embodiment, at the time of laminating (when the stacked first base material B1, the second base material substrate B2 and the third base material substrate B3 are heated and pressurized), the second base material substrate having a higher flowability than the first base material substrate B1 and the third base material substrate B3 is laminated on the first base material substrate B1 so as to straddle the stepped portion SP. Therefore, as compared with a case in which a multilayer board is formed by laminating a plurality of insulating base material layers made of the same material, it is possible to reduce or prevent the generation of gaps due to the stepped portion SP, and the separation of the multilayer board due to the generation of gaps.

More specifically, the first base material substrate B1, the second base material substrate B2, and the third base material substrate B3 are joined without gaps, the joint strength between the first base material substrate B1 and the second base material substrate B2 and the joint strength between the second base material substrate B2 and the third base material substrate B3 are improved, thus reducing or preventing the separation due to a deformation or other defects of the multilayer board.

The multilayer board 101 according to the present preferred embodiment includes the thick portion HP, and the thin portion FP that has a smaller thickness than the thick portion HP in the lamination direction of the plurality of insulating base material layers 11, 12, 13 (Z axis direction) and the thin portion FP is flexible. Therefore, the multilayer board is able to be easily disposed even within a limited space by utilizing the flexibility of the thin portion FP.

According to the present preferred embodiment, the second base material substrate B2 overlaps with the entire or substantially the entire portion at which the first base material substrate B1 and the third base material substrate B3 overlap with each other as viewed in the lamination direction of the plurality of insulating base material layers 11, 12, 13 (Z axis direction). This configuration reduces or prevents the formation of a new stepped portion after the lamination between the portion at which the second base material substrate B2 is disposed and the other portion. In addition, the joint strength between the first base material substrate B1 and the second base material substrate B2 or the joint strength between the third base material substrate B3 and the second base material substrate B2 is improved as compared with a case of only partially joining, with the second base material substrate B2, the portion at which the first base material substrate B1 and the third base material substrate B3 overlap with each other. Accordingly, the separation of the multilayer board is reduced or prevented as a result.

Second Preferred Embodiment

A second preferred embodiment of the present invention shows an example of a multilayer board without any thick portion or thin portion.

Figure 3:
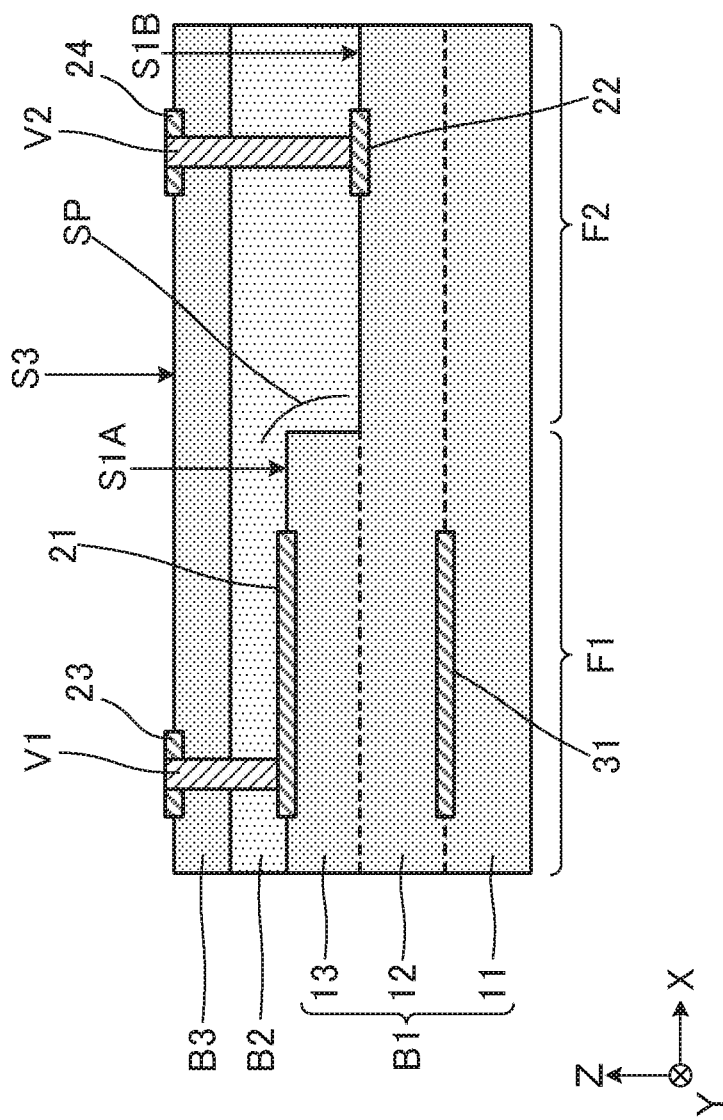
FIG. 3 is a cross-sectional view of a multilayer board 102 according to a second preferred embodiment of the present invention.

FIG. 3 is a cross-sectional view of a multilayer board 102 according to the second preferred embodiment.

The multilayer board 102 differs from the multilayer board 101 according to the first preferred embodiment in the structures of the second base material substrate B2 and the third base material substrate B3. Therefore, the multilayer board 102 includes no thick portion (refer to the thick portion HP in FIG. 1) or thin portion (refer to the thin portion FP in FIG. 1) provided due to a stepped portion SP. The other structure is the same or substantially the same as the multilayer board 101.

The difference from the multilayer board 101 according to the first preferred embodiment will be described below.

As shown in FIG. 3, according to the present preferred embodiment, a second base material substrate B2 is laminated on a first base material substrate B1 so as to straddle the stepped portion SP, thus smoothing a surface of the second base material substrate B2 (an upper surface of the second base material substrate B2 in FIG. 3) on the side opposite to the surface in contact with the first base material substrate B1. A third base material substrate B3 that is laminated on the second base material substrate B2 is a flat plate.

As described above, even where the first base material substrate B1 includes the stepped portion SP, the surface of the multilayer board is able to be leveled by laminating the second base material substrate B2 on the first base material substrate B1.

This second base material substrate B2 is preferably formed by, for example, applying an epoxy resin in the form of slurry to one surface (faces S1A, S1B of the first base material B1 in FIG. 3) of the first base material substrate B1, the one surface including the stepped portion SP. Alternatively, for example, the second base material substrate B2 which is a semi-cured state prepreg resin sheet may be stacked together with the first base material substrate B1 and the third base material substrate B3, and then heated and pressurized, thus providing such a multilayer board.

Third Preferred Embodiment

A third preferred embodiment of the present invention shows an example of a multilayer board in which a first base material substrate and a third base material substrate partially overlap as viewed in the lamination direction of a plurality of insulating base material layers.

Figure 4:
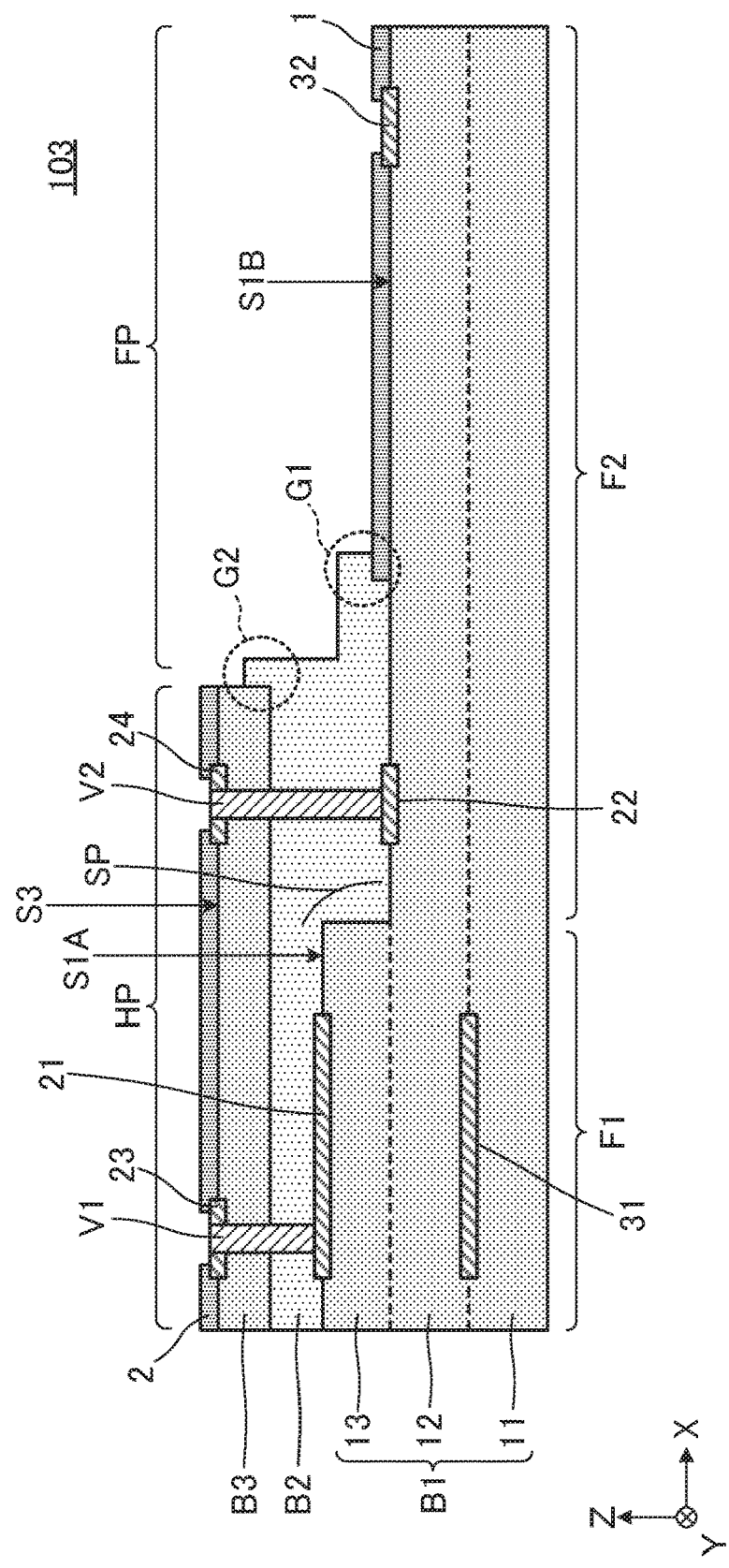
FIG. 4 is a cross-sectional view of a multilayer board 103 according to a third preferred embodiment of the present invention.

FIG. 4 is a cross-sectional view of a multilayer board 103 according to the third preferred embodiment.

The multilayer board 103 differs from the multilayer board 102 in that the second base material substrate B2 is also provided on another portion, in addition to the portion at which the first base material substrate B1 and the third base material substrate B3 overlap with each other, as viewed in the lamination direction of the plurality of insulating base material layers 11, 12, 13 (Z axis direction). In addition, the multilayer board 103 differs from the multilayer board 102 in terms of further including protective layers 1, 2, and other suitable layers. The other structure is the same or substantially the same as the multilayer board 102.

The difference from the multilayer board 102 according to the second preferred embodiment will be described below.

The first base material substrate B1 is a laminate formed by laminating the plurality of insulating base material layers 11, 12, 13 which are flexible. The insulating base material layers 11, 12 according to the present preferred embodiment have a larger length in the X axis direction than the insulating base material layers 11, 12 described in the first preferred embodiment.

The first base material substrate B1 includes a first conductor pattern 21, a second conductor pattern 22, conductor patterns 31, 32, and other suitable conductor patterns. The first conductor pattern 21, the second conductor pattern 22, and the conductor pattern 31 are the same or substantially the same as those described in the first preferred embodiment. The conductor pattern 32 is provided on the surface S1B which is partially in contact with the second base material substrate B2 in the second region F2, and is preferably a conductor pattern made of Cu foil or other suitable material, for example.

The protective layer 1 is provided partially on the surface S1B of the first base material substrate B1, the surface S1B being in contact with the second base material substrate B2. The protective layer 1 includes an opening at a position corresponding to the conductor pattern 32. Therefore, even if the protective layer 1 is provided on the surface S1B, a portion of the conductor pattern 32 is exposed from the opening of the protective layer 1. The protective layer 1 is preferably, for example, a solder resist film.

The protective layer 2 is provided on a surface S3 of the third base material substrate B3 on the side opposite to the surface in contact with the second base material B2. The protective layer 2 includes openings at positions corresponding to the third conductor pattern 23 and the fourth conductor pattern 24. Therefore, even if the protective layer 2 is provided on the surface S3, the third conductor pattern 23 and the fourth conductor pattern 24 are respectively exposed from the openings of the protective layer 2.

The second base material substrate B2 according to the present preferred embodiment is made of a material having a much higher flowability than the second base material substrate B2 described in the first preferred embodiment, during lamination (at the temperature of stacking, and then heating and pressurizing the first base material substrate B1, the second base material substrate B2, and the third base material substrate B3). Therefore, in the multilayer board 103 after lamination, the second base material substrate B2, as shown in FIG. 4, protrudes from the portion at which the first base material substrate B1 and the third base material substrate B3 overlap with each other as viewed in the Z axis direction.

The second base material substrate B2 is partially joined to an end surface and an upper surface of the protective layer 1 so as to cover the protective layer 1 provided on the surface of the first base material B1 (see coating portion G1 in FIG. 4). In addition, the second base material substrate B2 is also partially joined to a portion of an end surface of the third base material substrate B3 (see a coating portion G2 in FIG. 4).

In addition, as shown in FIG. 4, according to the present preferred embodiment, the thick portion HP is provided by the plurality of insulating base material layers 11, 12, 13, the second base material substrate B2, the third base material substrate B3, and the protective layer substrate 2, and the thin portion FP is provided by the plurality of insulating base material layers 11, 12 and the protective layer 1, for example.

Figure 5:
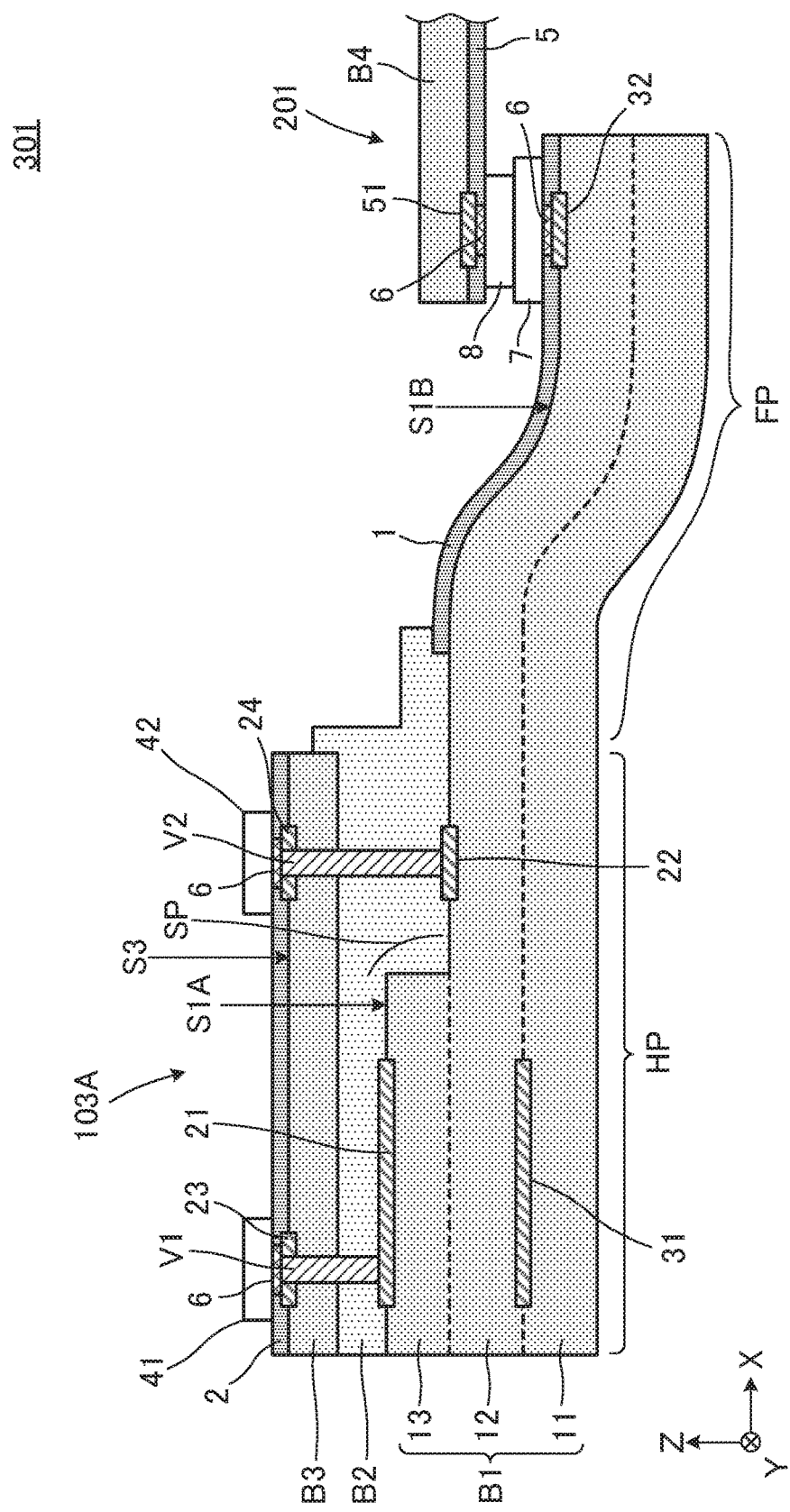
FIG. 5 is a cross-sectional view illustrating a main portion of an electronic device 301 according to the third preferred embodiment of the present invention.

Next, an electronic device including a multilayer board according to a preferred embodiment of the present invention will be described with reference to the drawing. FIG. 5 is a cross-sectional view illustrating a main portion of an electronic device 301 according to the third preferred embodiment. It is to be noted that the electronic device 301 also includes a housing and other structure, which do not appear in FIG. 5.

The electronic device 301 includes a multilayer board 103A, another board 201 and other components. The another board 201 is preferably, for example, a printed wiring board.

The another board 201 includes a base material substrate B4, a conductor pattern 51, a protective layer 5, and a receptacle 8. The conductor pattern 51 is provided on one main surface of the base material substrate B4 (the lower surface of the base material substrate B4 in FIG. 5), and is preferably a conductor pattern of Cu foil or other suitable material, for example. The protective layer 5 is provided on one main surface of the base material substrate B4. The protective layer 5 includes an opening in a portion thereof. Therefore, even if the protective layer 5 is provided on one main surface of the base material substrate B4, the conductor pattern 51 is exposed from the opening of the protective layer 5. The receptacle 8 is electrically connected to a portion of the conductor pattern 51 exposed from the opening of the protective layer 5, with a conductive joint material 6, such as solder, for example, interposed between the receptacle 8 and the portion of the conductor pattern 51. The protective layer 5 is preferably, for example, a solder resist film.

The multilayer board 103A differs from the multilayer board 103 in terms of including a connector 7 and surface-mounted components 41 and 42. The other structure is the same or substantially the same as that of the multilayer board 103.

The connector 7 is electrically connected to a portion of a third conductor pattern 32 exposed from an opening of a protective layer 1, with a conductive joint material 6 interposed between the connector 7 and the portion of the third conductor pattern 32. In addition, the surface-mounted component 41 is connected to a conductor pattern 23 with a conductive joint material 6 interposed therebetween, and the surface-mounted component 42 is connected to a fourth conductor pattern 24 with a conductive joint material 6 therebetween. The surface-mounted components 41 and 42 are preferably, for example, chip inductors or chip capacitors.

As shown in FIG. 5, the connector 7 of the multilayer board 103A is connected to the receptacle 8 of the another board 201. In this manner, the multilayer board 103A is, with the flexible thin portion FP bent, connected to the another board 201 (a circuit provided in the another board 201).

With this configuration, it is possible to achieve an electronic device including the multilayer board 103A which reduces or prevents the generation of gaps inside the multilayer board 103A after laminating the first base material substrate B1, the second base material substrate B2, and the third base material substrate B3. In addition, bending the flexible thin portion FP makes it easy to connect the multilayer board 103A and the another board 201.

The multilayer board 103 according to the present preferred embodiment produces the following advantageous effects, besides the advantageous effects described in the first and second preferred embodiments.

According to the present preferred embodiment, the second base material B2 is also partially joined to the portion of the end surface of the third base material substrate B3. This configuration increases the joint area between the second base material substrate B2 and the third base material substrate B3, and improves the joint strength between the second base material substrate B2 and the third base material substrate B3, thus reducing or preventing separation at the interface the second base material substrate B2 and the third base material substrate B3.

According to the present preferred embodiment, the second base material substrate B2 is partially joined to an end surface and an upper surface of the protective layer 1 so as to cover the protective layer 1 provided on the surface of the first base material substrate B1. This configuration increases the joint area of the second base material substrate B2, and improves the joint strength of the second base material substrate B2, thus reducing or preventing separation of the second base material substrate B2. In addition, this configuration makes it possible to reduce or prevent the separation of the protective layer 1 from the first base material substrate B1.

It is to be noted that the present preferred embodiment shows an example of partially joining the second base material substrate B2 to the end surface and upper surface of the protective layer 1, but even when the second base material substrate B2 is partially joined to the end surface of the protective layer 1, the actions and advantageous effects described above are achieved. However, in terms of the actions and advantages of reducing or preventing separation of the second base material substrate B2 and reducing or preventing separation of the protective layer 1 from the first base material substrate B1, the second base material substrate B2 is preferably joined to the end surface and upper surface of the protective layer 1.

In addition, the present preferred embodiment shows an example of the multilayer board in which the first base material substrate B1 and the third base material substrate B3 partially overlap as viewed in the Z-axis direction, and the second base material substrate B2 protrudes from the portion at which the first base material substrate B1 and the third base material substrate B3 overlap with each other as viewed in the Z-axis direction, but the present invention is not limited to this configuration. Even a configuration in which the first base material substrate B1 and the third base material substrate B3 entirely or substantially entirely overlap with each other as viewed in the Z axis direction, like the multilayer board 102 according to the second preferred embodiment, achieves the above-described actions and advantageous effects, as long as the second base material substrate B2 protrudes from the portion at which the first base material substrate B1 and the third base material substrate B3 overlap with each other.

Fourth Preferred Embodiment

A fourth preferred embodiment of the present invention shows another example of a multilayer board including a first base material substrate and a third base material substrate that partially overlap as viewed in the lamination direction of a plurality of insulating base material layers, which is different from the multilayer board shown in the third preferred embodiment.

Figure 6:
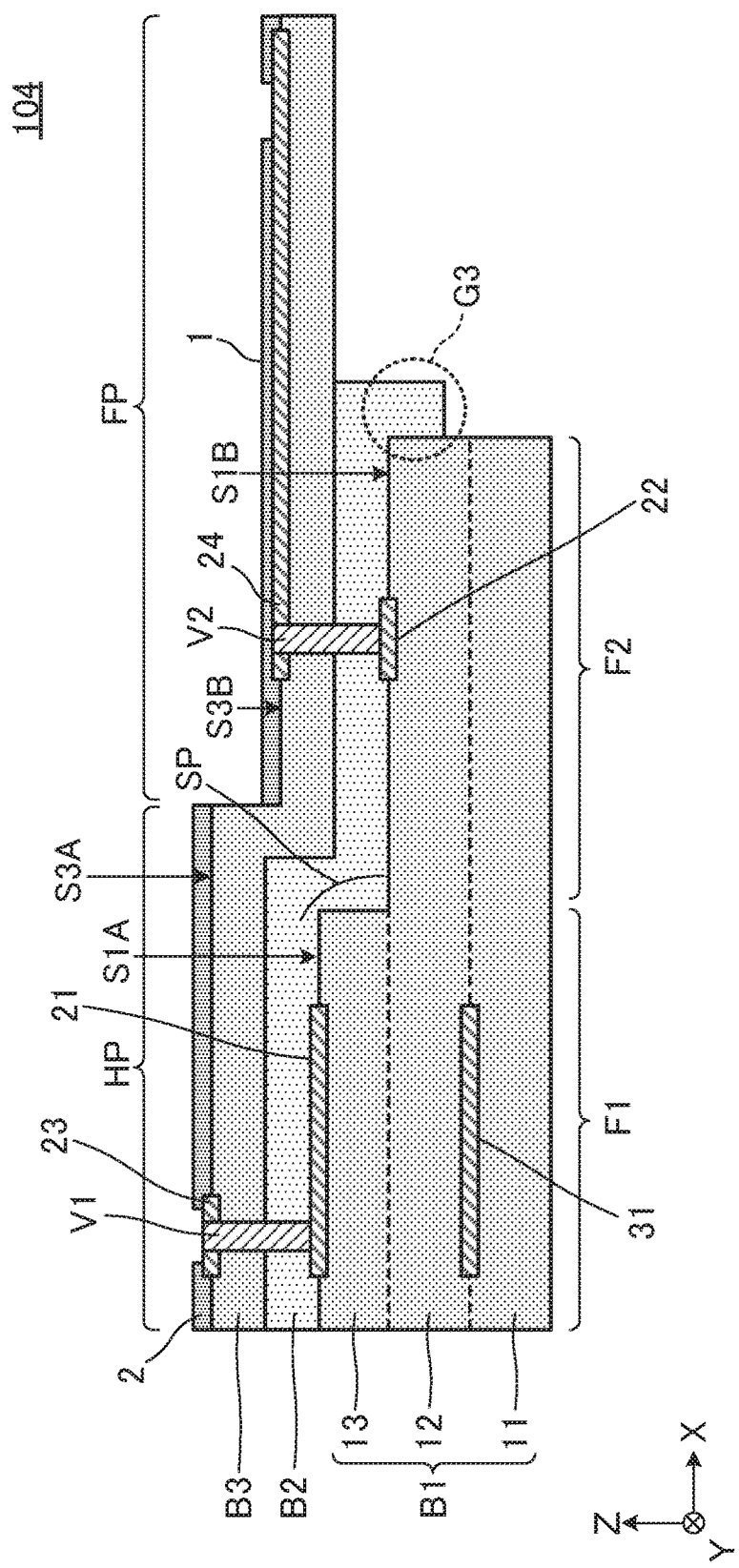
FIG. 6 is a cross-sectional view of a multilayer board 104 according to a fourth preferred embodiment of the present invention.

FIG. 6 is a cross-sectional view of a multilayer board 104 according to the fourth preferred embodiment.

The multilayer board 104 differs from the multilayer board 101 according to the first preferred embodiment in the configuration of the third base material substrate B3. In addition, the multilayer board 104 differs from the multilayer board 101 in that a second base material substrate B2 is also provided on another portion, besides the portion at which a first base material substrate B1 and a third base material substrate B3 overlap with each other as viewed in the lamination direction of a plurality of insulating base material layers 11, 12, 13 (Z axis direction). The other structure is the same or substantially the same as the multilayer board 101.

The difference from the multilayer board 101 according to the first preferred embodiment will be described below.

The third base material substrate B3 according to the present preferred embodiment has a larger length in the X axis direction than the third base material substrate described in the first preferred embodiment. In addition, a fourth conductor pattern 24 according to the present preferred embodiment has a larger length in the X axis direction than the fourth conductor pattern described in the first preferred embodiment.

A protective layer 1 is provided on a surface S3B of the third base material substrate B3 on the side opposite to a surface in contact with the second base material substrate B2 in a thin portion FP. The protective layer 1 includes an opening in a portion thereof. Therefore, even if the protective layer 1 is provided on the surface S3B, a portion of the fourth conductor pattern 24 is exposed from the opening of the protective layer 1.

A protective layer 2 is provided on a surface S3A of the third base material substrate B3 on the side opposite to a surface in contact with the second base material substrate B2 in a thick portion HP. The protective layer 2 includes an opening at a position corresponding to a third conductor pattern 23. Therefore, the protective layer 2 is provided on the surface S3A, the third conductor pattern 23 is exposed from the opening of the protective layer 2.

The second base material substrate B2 according to the present preferred embodiment is made of a material having a much higher flowability than the second base material substrate described in the first preferred embodiment, during lamination (at the temperature of stacking, and then heating and pressurizing the first base material substrate B1, the second base material substrate B2, and the third base material substrate B3). Therefore, in the multilayer board 104 after lamination, as shown in FIG. 6, the second base material substrate B2 protrudes from the portion at which the first base material substrate B1 and the third base material substrate B3 overlap with each other as viewed in the Z axis direction.

The second base material substrate B2 is also partially joined to a portion of an end surface of the first base material substrate B1 (see a coating portion G3 in FIG. 6).

The multilayer board 104 according to the present preferred embodiment produces the following advantageous effect, besides the advantageous effects described in the first preferred embodiment.

According to the present preferred embodiment, the second base material B2 is also partially joined to the portion of the end surface of the first base material substrate B1. This configuration increases the joint area between the second base material substrate B2 and the first base material substrate B1, and improves the joint strength between the second base material substrate B2 and the first base material substrate B1, thus reducing or preventing separation at the interface the second base material substrate B2 and the first base material substrate B1.

Fifth Preferred Embodiment

A fifth preferred embodiment shows an example in which the configuration of the second base material substrate is different from those of the preferred embodiments described above.

Figure 7:
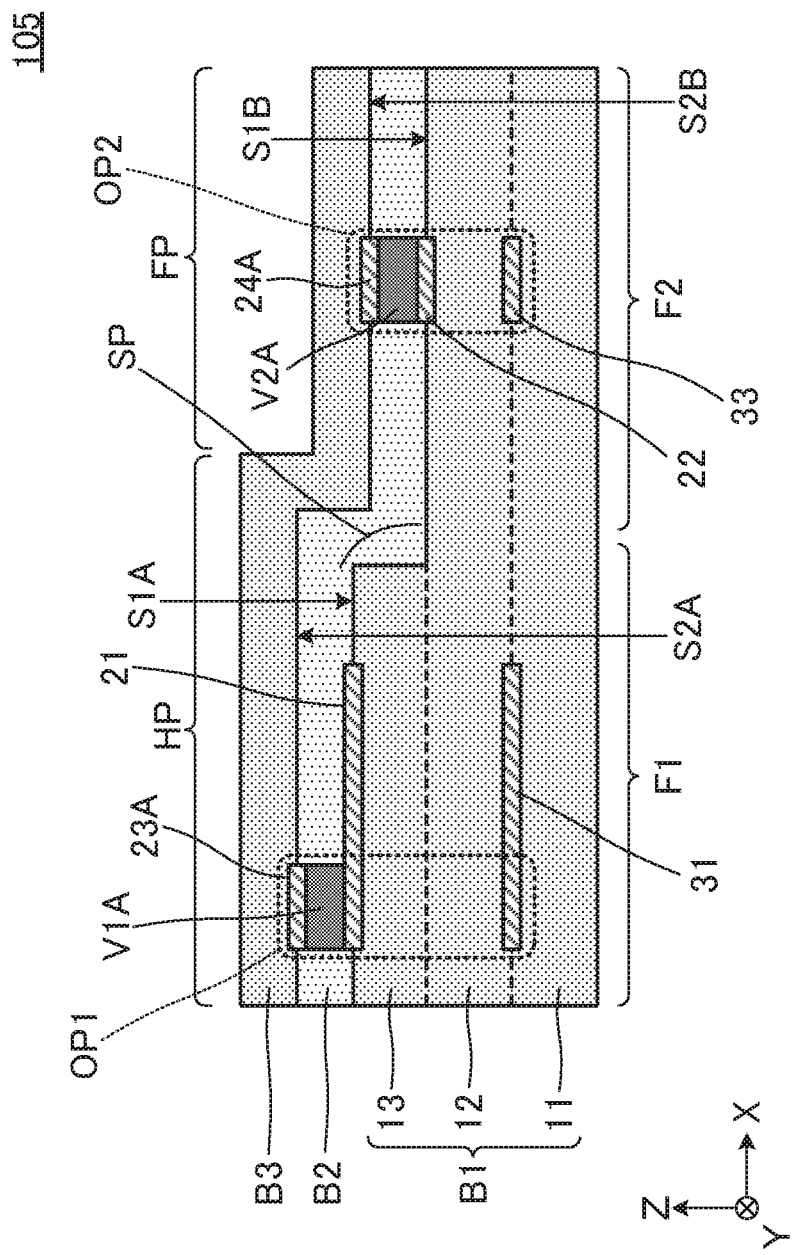
FIG. 7 is a cross-sectional view of a multilayer board 105 according to a fifth preferred embodiment of the present invention.

FIG. 7 is a cross-sectional view of a multilayer board 105 according to the fifth preferred embodiment.

The multilayer board 105 differs from the multilayer board 101 according to the first preferred embodiment in the configurations of the third conductor pattern 23A and the fourth conductor pattern 24A. The other configuration is substantially the same as the multilayer board 101.

The difference from the multilayer board 101 according to the first preferred embodiment will be described below.

The first base material B1 is substantially the same as described in the first preferred embodiment. A conductor pattern 33 is further provided on an insulating base material layer 11 according to the present preferred embodiment. The conductor pattern 33 is provided by laminating a metal foil (for example, Cu foil) on one main surface of the insulating base material layer 11, and then patterning the metal foil by photolithography, for example. The conductor pattern 33 is a dummy conductor which is not connected to another conductor pattern.

The third base material substrate B3 includes a third conductor pattern 23A and a fourth conductor pattern 24A. The third conductor pattern 23A is provided on a surface S2A of the third base material substrate B3, the surface S2A being in contact with the second base material substrate B2. In addition, the fourth conductor pattern 24A is provided on a surface S2B of the third base material substrate B3, the surface S2B being in contact with the second base material substrate B2. It is to be noted that unlike the third conductor pattern 23 and the fourth conductor pattern 24 described in the first preferred embodiment, the third conductor pattern 23A and the fourth conductor pattern 24A include no openings.

The second base material substrate B2 according to this preferred embodiment is preferably an insulating anisotropic conductive film (ACF) obtained by molding, into a film, a semi-cured prepreg resin sheet in which fine conductive particles are dispersed. When this second base material substrate B2 is pressurized, the film thickness is reduced at a location of the second base material substrate B2 to which a pressure equal to or higher than a predetermined pressure is applied, so that the second base material substrate B2 exhibits conductivity in the thickness direction at the location.

The second base material substrate B2 includes a first interlayer connection conductor V1A and a second interlayer connection conductor V2A. The first interlayer connection conductor V1A is a portion that is sandwiched between the first conductor pattern 21 and the third conductor pattern 23A and is partially pressurized for conduction. The second interlayer connection conductor V2A is a portion that is sandwiched between the second conductor pattern 22 and the fourth conductor pattern 24A and is partially pressurized for conduction.

According to the present preferred embodiment, the second base material substrate B2 has a higher flowability than the first base material substrate B1 and the third base material substrate B3 when the first base material substrate B1, the second base material substrate B2, and the third base material substrate B3 are laminated (at the temperature of stacking, and then pressurizing the first base material substrate B1, the second base material substrate B2, and the third base material substrate B3). In addition, preferably, the second base material substrate B2, which is an insulating anisotropic conductive film, has a lower elastic modulus than the first base material substrate B1 and the third base material substrate B3 made of a liquid crystal polymer.

In addition, as shown in FIG. 7, as viewed in the lamination direction of the plurality of insulating base material layers, the numbers of conductor patterns in an area that overlaps with the first interlayer connection conductor V1A and the number of conductor patterns in an area that overlaps with the second interlayer connection conductor V2A are larger than the number of conductor patterns in the other areas.

Specifically, as viewed in the Z axis direction, the number of conductor patterns in the area that overlap with the first interlayer connection conductor V1A is preferably 3, for example (see a stacked portion OP1 in FIG. 7). As described above, according to the present preferred embodiment, the conductor pattern 33 (dummy conductor) which is not connected to another conductor pattern is disposed in the area that overlaps with the second interlayer connection conductor V2A as viewed in the Z axis direction. Therefore, as viewed in the Z axis direction, the number of conductor patterns in the area that overlap with the second interlayer connection conductor V2A is preferably 3, for example (see a stacked portion OP2 in FIG. 7).

The multilayer board 105 according to the present preferred embodiment produces the following advantageous effect, besides the advantageous effects described in the first preferred embodiment.

According to the present preferred embodiment, the second base material substrate B2 is an insulating anisotropic conductive film, and the third conductor pattern 23A and the fourth conductor pattern 24A are provided on the surfaces S2A and S2B in contact with the second base material substrate B2. With this configuration, a portion of the second base material substrate B2 sandwiched between the first conductor pattern 21 and the third conductor pattern 23A, when the first base material substrate B1, the second base material substrate B2, and the third base material substrate B3 are stacked and then pressurized, establishes conduction under pressure, so that the first interlayer connection conductor V1A is able to be easily provided. In addition, with this configuration, a portion of the second base material substrate B2 sandwiched between the second conductor pattern 22 and the fourth conductor pattern 24A, when the first base material substrate B1, the second base material substrate B2, and the third base material substrate B3 are stacked and then pressurized, establishes conduction under pressure so that the second interlayer connection conductor V2A is able to be easily provided.

In addition, according to the present preferred embodiment, the second base material substrate B2 has a lower elastic modulus than the first base material substrate B1 and the third base material substrate B3. With this configuration, when the multilayer board is bent or deformed, the second base material substrate B2 that has a lower elastic modulus than the first base material substrate B1 and the third base material substrate B3 is deformed in accordance with the deformations of the first base material substrate B1 and the third base material substrate B3, thus reducing or preventing separation due to a deformation or other defect of the multilayer board.

According to the present preferred embodiment, as viewed in the lamination direction of the plurality of insulating base material layers (Z axis direction), the number of conductor patterns in an area that overlaps with the first interlayer connection conductor V1A and the number of conductor patterns in an area that overlaps with the second interlayer connection conductor V2A are larger than the number of conductor patterns in the other areas. With this configuration, when the first base material substrate B1, the second base material substrate B2, and the third base material substrate B3 are stacked and then pressurized, a pressure is more likely to be applied to the area that overlaps with the first interlayer connection conductor V1A and the area that overlaps with the second interlayer connection conductor V2A than to the other areas, and the first interlayer connection conductor V1A and the second interlayer connection conductor V2A are unlikely to cause defective conduction.

In addition, according to the present preferred embodiment, the conductor pattern 33 (dummy conductor) which is not connected to another conductor pattern is disposed in the area that overlaps with the second interlayer connection conductor V2A as viewed in the Z axis direction. As described above, a dummy conductor may be provided in order to make a pressure more likely to be applied to the area that overlaps with the second interlayer connection conductor V2A than the other portions, when the first base material substrate B1, the second base material substrate B2, and the third base material substrate B3 are stacked and then pressurized. In addition, the number of overlapping conductor patterns may be adjusted as viewed in the Z axis direction by providing an opening in the conductor pattern.

It is to be noted that the present preferred embodiment shows an example in which the conductor pattern 33 (dummy conductor) is disposed only in the area that overlaps with the second interlayer connection conductor V2A as viewed in the Z axis direction, but the present invention is not limited to this configuration. A dummy conductor may be disposed in an area that overlaps with the first interlayer connection conductor V1A as viewed in the Z axis direction.

Figure 8:
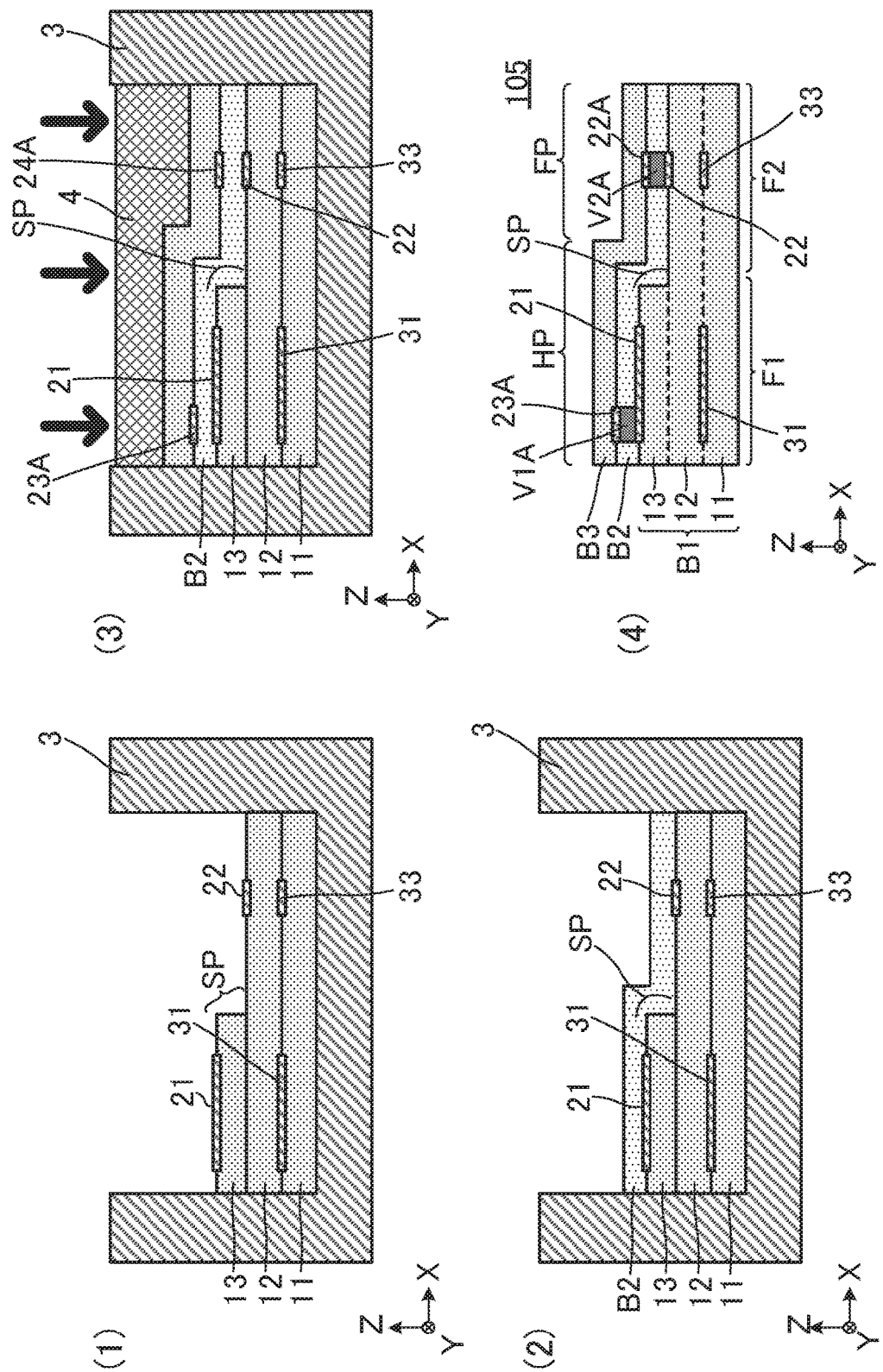
FIG. 8 is a cross-sectional view illustrating successive steps of manufacturing the multilayer board 105.

The multilayer board 105 according to the present preferred embodiment is manufactured by, for example, the following non-limiting example of a manufacturing method. FIG. 8 is a cross-sectional view illustrating successive steps of manufacturing the multilayer board 105.

First, as shown in step (1) of FIG. 8, the plurality of insulating base material layers 11, 12, 13 are stacked inside a mold 3 made of metal.

It is to be noted that the first conductor pattern 21, the second conductor pattern 22, and the conductor pattern 31 are respectively formed on the multiple insulating base material layers 11, 12, 13.

Next, as shown in step (2) of FIG. 8, the second base material substrate B2 is stacked on the insulating base material layers 12, 13 so as to straddle a stepped portion SP. The second base material substrate B2 is preferably, for example, an insulating anisotropic conductive film (ACF) obtained by molding, into a film, a semi-cured prepreg resin sheet in which fine conductive particles are dispersed.

Next, as shown in step (3) of FIG. 8, the third base material substrate B3 is stacked on the second base material substrate B2, a rigid body 4 is stacked on the third base material substrate B3, and the plurality of insulating base material layers 11, 12, 13, the second base material substrate B2, and the third base material substrate B3 are then heated and pressurized (laminated) together. Specifically, the plurality of insulating base material layers 11, 12, 13, the second base material substrate B2, and the third base material substrate B3 are pressed (heated and pressurized) in the direction of the arrows shown in step (3) of FIG. 8. In this regard, the portion of the second base material substrate B2, sandwiched between the first conductor pattern 21 and the third conductor pattern 23A and partially pressurized, establishes conduction to define and function as the first interlayer connection conductor V1A. In addition, the portion of the second base material substrate B2, sandwiched between the second conductor pattern 22 and the fourth conductor pattern 24A and partially pressurized, establishes conduction to define and function as the second interlayer connection conductor V2A. The rigid body 4 is, for example, a mold with irregularities.

After the steps mentioned above, the multilayer board 105 as shown in step (4) of FIG. 8 is removed from the mold 3.

The preferred embodiments described above show examples in which the first base material substrate B1, the second base material substrate B2, and the third base material substrate B3 have a rectangular or substantially rectangular planar shape, but the present invention is not limited to this configuration. The planar shapes of the first base material substrate B1, the second base material substrate B2, and the third base material substrate B3 may be changed appropriately within a scope that achieves the actions and advantageous effect of the present invention, and may be, for example, polygonal, circular, elliptical, L-shaped, crank-shaped, T-shaped, Y-shaped, or other suitable shapes.

It is to be noted that the preferred embodiments described above show examples in which the first base material substrate B1 is a laminate including three insulating base material layers, and the second base material substrate B2 and the third base material substrate B3 are each a single layer, but the present invention is not limited to this configuration. The number of laminated layers for the first base material substrate B1, the second base material substrate B2, and the third base material substrate B3 may be changed appropriately within a scope that achieves the actions and advantageous effects of the present invention. For example, the first base material substrate B1 may include two insulating base material layers that are laminated, and the second base material substrate B2 and the third base material substrate B3 may include a plurality insulating base material layers that are laminated.

In addition, the preferred embodiments described above show examples in which the first base material substrate B1 and the third base material substrate B3 are made of a thermoplastic resin, and the second base material substrate B2 is made of a thermosetting resin, but the present invention is not limited to this configuration. As long as the effects and advantageous effects of the present invention are achieved, the first base material substrate B1 and the third base material substrate B3 may be made of a thermosetting resin, and the second base material substrate B2 may be made of a thermoplastic resin. Alternatively, the first base material substrate B1, the second base material substrate B2, and the third base material substrate B3 may be all made of a thermosetting resin, or the first base material substrate B1, the second base material substrate B2, and the third base material substrate B3 may be all made of a thermoplastic resin.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer board comprising:
   a first base material substrate including a plurality of insulating base material layers that are laminated and include a resin as a main material, the first base material substrate including a first region and a second region that includes a smaller number of the plurality of insulating base material layers than the first region;
   a second base material substrate laminated on the first base material substrate to straddle a stepped portion provided at a boundary between the first region and the second region due to a difference in the number of the plurality of insulating base material layers; and a third base material substrate laminated on the second base material substrate; wherein the first base material substrate includes a first conductor pattern provided on a surface in contact with the second base material substrate in the first region, and a second conductor pattern provided on a surface in contact with the second base material substrate in the second region;

the third base material substrate includes a third conductor pattern and a fourth conductor pattern; and the second base material substrate includes a first interlayer connection conductor that connects the first conductor pattern and the third conductor pattern, and a second interlayer connection conductor that connects the second conductor pattern and the fourth conductor pattern, and has a higher flowability than the first base material substrate and the third base material substrate when the first base material substrate, the second base material substrate, and the third base material substrate are laminated.

2. The multilayer board according to claim 1, further comprising:

a thick portion provided due to the stepped portion; and a thin portion provided due to the stepped portion; wherein the thin portion has a smaller thickness than the thick portion in a lamination direction of the plurality of insulating base material layers; and the thin portion is flexible.

3. The multilayer board according to claim 1, wherein the second base material substrate entirely or substantially entirely overlaps with a portion at which the first base material substrate and the third base material substrate overlap with each other as viewed in the lamination direction of the plurality of insulating base material layers.

4. The multilayer board according to claim 1, wherein the second base material substrate is joined to an end surface of the first base material substrate or an end surface of the third base material substrate.

5. The multilayer board according to claim 1, wherein the second base material substrate has a lower elastic modulus than the first base material substrate and the third base material substrate.

6. The multilayer board according to claim 1, wherein the third conductor pattern and the fourth conductor pattern are provided on a surface in contact with the second base material substrate; and the second base material substrate is an insulating anisotropic conductive film.

7. The multilayer board according to claim 6, wherein the first base material substrate and the third base material substrate include conductor patterns other than the first conductor pattern, the second conductor pattern, the third conductor pattern, and the fourth conductor pattern; and a number of conductor patterns in an area that overlaps with the first interlayer connection conductor and an area that overlaps with the second interlayer connection conductor is larger than a number of overlapping conductor patterns in another area, as viewed in the lamination direction of the plurality of insulating base material layers.

8. The multilayer board according to claim 6, wherein the first base material substrate and the third base material substrate include conductor patterns other than the first conductor pattern, the second conductor pattern, the third conductor pattern, and the fourth conductor pattern; and a dummy conductor that is not connected to another conductor pattern is disposed in an area that overlaps with the first interlayer connection conductor or in an area that overlaps with the second interlayer connection conductor, as viewed in the lamination direction of the plurality of insulating base material layers.

9. The multilayer board according to claim 1, wherein the first base material substrate and the third base material substrate are made of a thermoplastic resin, and the second base material substrate is made of a thermosetting resin.

10. The multilayer board according to claim 1, wherein the plurality of insulating base material layers include a liquid crystal polymer as a main material.

11. An electronic device comprising:

a multilayer board; and another board; wherein the multilayer board includes:

a first base material substrate including a plurality of insulating base material layers that are laminated and include a resin as a main material, the first base material substrate including a first region and a second region that includes a smaller number of the plurality of insulating base material layers than the first region;

a second base material substrate laminated on the first base material substrate to straddle a stepped portion provided at a boundary between the first region and the second region due to a difference in the number of the plurality of insulating base material layers;

a third base material substrate laminated on the second base material;

a thick portion provided due to the stepped portion; and a thin portion provided due to the stepped portion, the thin portion having a smaller thickness than the thick portion in a lamination direction of the plurality of insulating base material layers;

the thin portion is flexible;

the first base material substrate includes a first conductor pattern provided on a surface in contact with the second base material substrate in the first region, and a second conductor pattern provided on a surface in contact with the second base material substrate in the second region;

the third base material substrate includes a third conductor pattern and a fourth conductor pattern;

the second base material substrate includes a first interlayer connection conductor that connects the first conductor pattern and the third conductor pattern, and a second interlayer connection conductor that connects the second conductor pattern and the fourth conductor pattern, and has a higher flowability than the first base material substrate and the third base material substrate when the first base material substrate, the second base material substrate, and the third base material substrate are laminated; and the multilayer board is, with the thin portion bent, connected to the another board.

12. The electronic device according to claim 11, wherein the second base material substrate entirely or substantially entirely overlaps with a portion at which the first base material substrate and the third base material substrate overlap with each other as viewed in the lamination direction of the plurality of insulating base material layers.

13. The electronic device according to claim 11, wherein the second base material substrate is joined to an end surface of the first base material substrate or an end surface of the third base material substrate.

14. The electronic device according to claim 11, wherein the second base material substrate has a lower elastic modulus than the first base material substrate and the third base material substrate.

15. The electronic device according to claim 11, wherein
the third conductor pattern and the fourth conductor pattern are provided on a surface in contact with the second base material substrate; and
the second base material substrate is an insulating anisotropic conductive film.

16. The electronic device according to claim 15, wherein
the first base material substrate and the third base material substrate include conductor patterns other than the first conductor pattern, the second conductor pattern, the third conductor pattern, and the fourth conductor pattern; and
a number of conductor patterns in an area that overlaps with the first interlayer connection conductor and an area that overlaps with the second interlayer connection conductor is larger than a number of overlapping conductor patterns in another area, as viewed in the lamination direction of the plurality of insulating base material layers.

17. The electronic device according to claim 15, wherein
the first base material substrate and the third base material substrate include conductor patterns other than the first conductor pattern, the second conductor pattern, the third conductor pattern, and the fourth conductor pattern; and
a dummy conductor that is not connected to another conductor pattern is disposed in an area that overlaps with the first interlayer connection conductor or in an area that overlaps with the second interlayer connection conductor, as viewed in the lamination direction of the plurality of insulating base material layers.

18. The electronic device according to claim 11, wherein the first base material substrate and the third base material substrate are made of a thermoplastic resin, and the second base material substrate is made of a thermosetting resin.

19. The electronic device according to claim 11, wherein the plurality of insulating base material layers include a liquid crystal polymer as a main material.

* * * * *